United States Patent [19]

Boeters

[11] 4,032,964

[45] June 28, 1977

[54] MULTIPLE HYBRID SEMICONDUCTOR STRUCTURE

[75] Inventor: Karl-Ernst Boeters, Berlin, Germany

[73] Assignee: Robert Bosch G.m.b.H., Stuttgart, Germany

[22] Filed: Feb. 23, 1976

[21] Appl. No.: 660,719

[30] Foreign Application Priority Data

Mar. 13, 1975  Germany .................... 2510982

[52] U.S. Cl. .................... 357/74; 357/75; 357/81
[51] Int. Cl.² .................. H01L 23/02; H01L 23/16
[58] Field of Search .................... 357/74, 75, 81

[56] References Cited

UNITED STATES PATENTS

| | | |
|---|---|---|
| 3,662,230 | 5/1972 | Redwantz .................... 357/75 |
| 3,715,633 | 2/1973 | Nier .................... 357/74 |
| 3,739,241 | 6/1973 | Thillays .................... 357/75 |

*Primary Examiner*—Edward J. Wojciechowicz
*Attorney, Agent, or Firm*—Flynn & Frishauf

[57] ABSTRACT

To facilitate manufacture and assembly of the structural support and electrical connections of a composite driver and power semiconductor element, the metal base plate of the composite structure carries the driver power element, and the driver element is supported, in insulated relation with respect thereto, on a post formed as a rotation-symmetrical body, typically a flat-ended cylinder or a headed wire, and carried through the base plate, for example by a glass seal. Each one of the driver and power elements may, themselves, be composite integrated circuits, the power element being preferably a Darlington unit, the driver element including transistor and a Zener diode and associated resistors.

10 Claims, 5 Drawing Figures

MULTIPLE HYBRID SEMICONDUCTOR STRUCTURE

The present invention relates to a composite hybrid semiconductor structure in which multiple semiconductor elements are included within a common housing. One of the elements, typically, is a power transistor and secured to the base plate of the structure, the other element forming a driver unit therefor.

Composite multiple hybrid semiconductor structures have previously been proposed, in which a metal strip or flag is provided to form the carrier or support for the semiconductor structure, to which a pin is secured, for example by soldering. Such arrangement is difficult to make and to assemble.

It is an object of the present invention to provide a composite multiple hybrid semiconductor structure, typically one which can accomodate both a power transistor unit and a driver transistor unit and, preferably, also additional circuit elements, which is simple to make and in which the components can be easily assembled.

SUBJECT MATTER OF THE PRESENT INVENTION

Briefly, the structure includes a base plate on which one of the elements is secured, preferably the power element (to provide for good heat dissipation characteristics); a rotation symmetrical body in the form of a post, cylindrical with a flat end, or a headed wire, is passed through the base plate in insulated relation thereto, for example by means of a glass seal.

The invention will be described by way of example with reference to the accompanying drawings, wherein.

The semiconductor structure includes two semiconductor bodies 10, 11, each formed as a chip of semiconductor crystal. The first chip 10 forms a power semiconductor element; the second chip 11 is the driver element for the power element 10.

Figure 2:
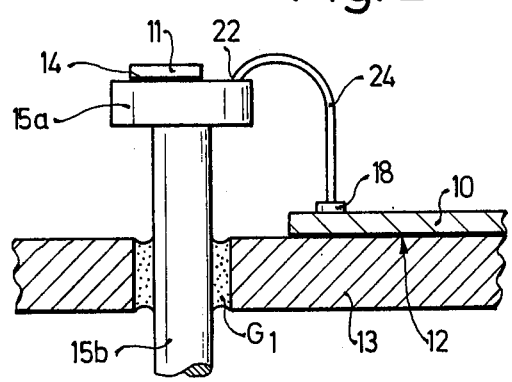
FIG. 2 is a fragmentary section along lines II—II of FIG. 1.

The power element 10 is formed with a connecting contact 12 (FIG. 2) at its underside. Terminal 12 extends throughout the power element. The chip 10 is soldered to a base plate 13, for example by means of the terminal element 12. Base plate 13 forms a portion of the housing for the structure and, simultaneously, one of the electrode connections for element 10. A cylindrical metallic terminal post 9 is electrically and mechanically secured to the underside of base plate 13, for example by brazing or butt-welding. Post 9 forms one of the electrical connections to the structure.

Figure 4:
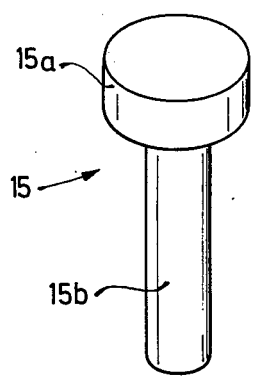
FIGS. 4 and 5 are perspective views of respective embodiments of the rotation symmetrical support for one of the elements.

The second semiconductor body 11 is supported on a support carrier 15; carrier 15 has the form or shape of a post, for example as a headed wire (FIG. 4) or (FIG. 5) as a cylindrical post 15' with a flat end face. The carrier 15 (FIGS. 2, 4) has a header portion 15a which is integral with a lower wire-shaped portion 15b. The wire-shaped portion 15b is passed through an opening in the base plate 13 by means of a glass seal $G_1$, thus providing for secure mechanical attachment of portion 15b while effecting electrical insulation between the carrier 15 and base plate 13. The upper header portion 15a is located within the housing of the semiconductor structure. The top surface of the header portion 15a is flat; the second semiconductor element 11 is soldered to the flat header portion 15a. The lower side of the second element 11 has a connecting surface 14 (FIG. 2) formed throughout its extent, forming simultaneously the electrical terminal as well as the solder surface to provide for electrical connection to the carrier 15 and for mechanical attachment of the element 11. The wire-shaped portion 15b forms a contact post for the structure to permit electrical connection to the underside of the semiconductor body 11 separate and apart, and insulated from any electrical connection to base plate 13.

Two additional metal terminal posts 16, 17 are carried through the base plate 13, held mechanically while being electrically insulated by glass melts $G_2$, $G_3$.

Figure 1:
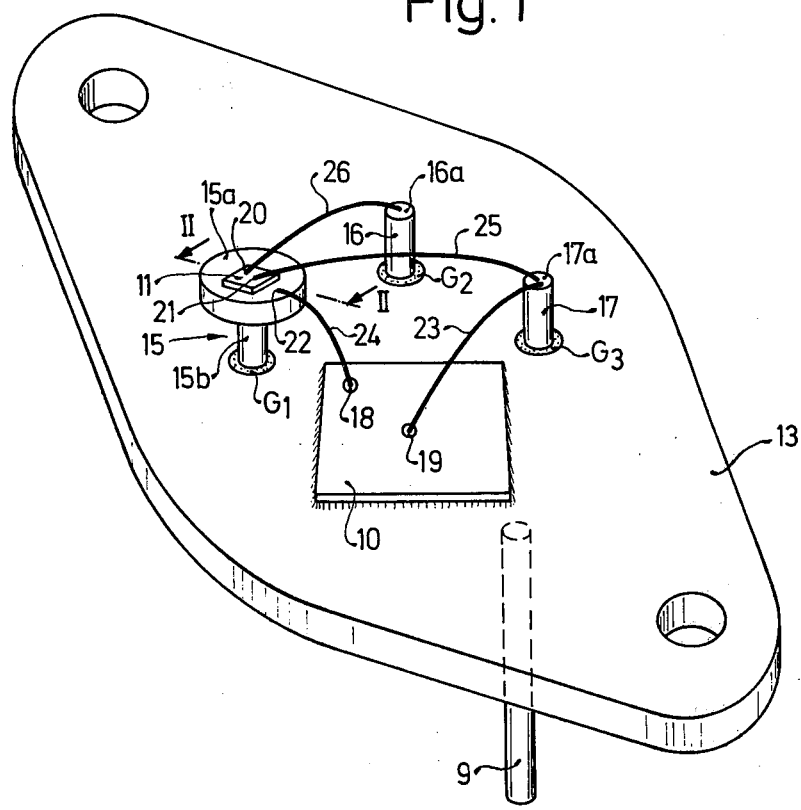
FIG. 1 is a perspective view of the composite element, with the outer cover removed.

Semiconductor body 10 is formed with electrical contact terminals 18, 19 at the upper side thereof (see FIG. 1). Semiconductor body 11 is formed with second and third metallic contact terminals 20, 21.

A first bonding wire 23 connects terminal 19 of the power semiconductor body 10 to the upper flat surface 17a of terminal post 17; bonding wire 24 connects terminal 18 of element 10 to contact point 22 formed on the upper flat surface of header 15a of carrier 15. A third bonding wire 25 connects from a third terminal 21 of element 11 to the surface 17a of terminal 17; a fourth bonding wire 26 connects from the second terminal contact 20 of element 11 to the upper surface 16a of post 16.

Figure 3:
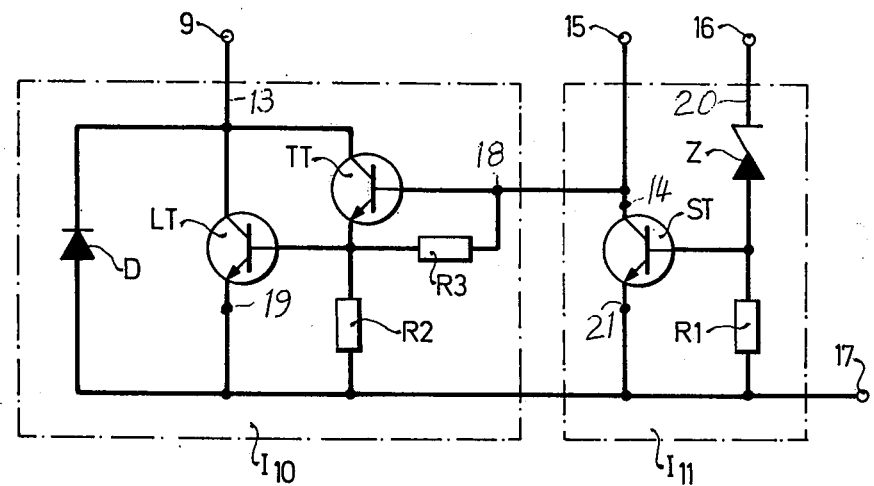
FIG. 3 is the electrical circuit diagram of a hybrid semiconductor structure, in which the semiconductor elements are monolithic integrated circuits (IC's)

The two semiconductor elements 10, 11 may each be discrete elements, each forming, for example, only a single transistor or other semiconductor element. The elements 10, 11 may, however, themselves be monolithic integrated circuits $I_{10}$, $I_{11}$ made, for example by planar technology. One such example of composite elements 10, 11 is seen in FIG. 3 in which both, element 10 as well as element 11, include an integrated circuit. The broken lines indicate which ones of the circuit components are included in the respective semiconductor elements.

The driver element 11 includes a control transistor ST, a resistor $R_1$ in parallel to the base-emitter junction of the transistor ST, and a Zener diode Z having its anode connected to the base of the control transistor. The first terminal 14, soldered to the carrier 15, forms the collector terminal of transistor ST. The second terminal 20 forms the cathode connection to the Zener diode Z. The third terminal 21 is the emitter connection of the control transistor ST.

The semiconductor element 10 is a Darlington transistor unit including a driver transistor TT and a power output transistor LT, the collector of which is connected to the collector of the driver transistor, and the base of which is connected to the emitter of the driver transistor. A resistor $R_3$ is connected in parallel to the base-emitter junction of the driver transistor TT. Resistor R2 is connected in parallel to the base emitter junction of the power transistor LT. A diode D is connected across the collector-emitter terminals of power transistor LT. The first terminal 12 of the semiconductor element 10, soldered to the base plate 13, and electrically connected to terminal post 9, is the common collector terminal for the two transistors TT, LT and for the diode D; the second terminal 18 (FIG. 1) forms the base connection of the driver transistor TT and the third terminal 19 the emitter connection of the power transistor LT.

Figure 5:
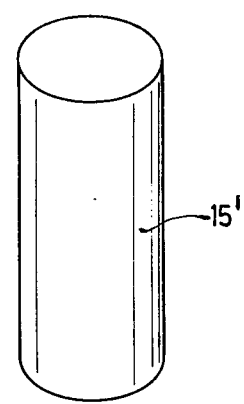

The carrier for semiconductor element 11 may have various forms, provided that it forms an end surface on which the second semiconductor 11 can be secured. FIG. 5 illustrates a cylindrical carrier 15' formed of an element having a diameter of approximately the diameter of the header portion 15a of carrier 15 illustrated in FIG. 4.

Both of the semiconductor elements 10, 11 can be secured to their base supports in various ways; rather than soldering, they can be alloyed thereon. The driver semiconductor element 11, which operates at low signal and low power levels, can also be secured to its attachment carrier by an electrically conductive adhesive.

Various changes and modifications may be made within the scope of the inventive concept.

I claim:

1. Multiple hybrid semiconductor structure comprising a power semiconductor element (10) and a driver or low-power semiconductor element (11) connected to drive said power element (10);

an apertured base plate (13) to which said power semiconductor element (10) is secured to provide a heat sink and heat dissipating element therefore;

a combination support carrier and electrical terminal (15) comprising a metallic rotation-symmetrical body (15, 15') passing through an aperture of the base plate on which the other of said elements (11) is secured;

and an insulating seal ($G_1$) mechanically securing and electrically insulating the rotation symmetrical support carrier (15, 15') in, and with respect to the base plate (13) whereby said carrier (15, 15') will directly support the driver semiconductor element (11) and form a terminal post for the structure which is electrically separate from the base plate (13).

2. Structure according to claim 1, wherein (FIG. 4) the metallic rotation-symmetrical body comprises a headed wire (15).

3. Structure according to claim 1, wherein (FIG. 5) the metallic rotation-symmetrical body comprises a cylindrical element (15') having an essentially flat end surface.

4. Structure according to claim 1, wherein the power element (10) is attached to the base plate (13) of one side of the power element and terminal contacts (18, 19) are formed on the power element (10) at the side thereof remote from its attachment to the base plate (13);

terminal posts (16, 17) are provided, leading through the base plate, mechanically secured thereto and electrically insulated therefrom;

and bonding wires (23, 24, 25) connecting the terminal contacts and said terminal posts.

5. Structure according to claim 1, wherein at least one of the semiconductor elements comprises a monolithic integrated circuit ($I_{10}$, $I_{11}$).

6. Structure according to claim 5, wherein the driven semiconductor element (11) comprises a monolithic integrated circuit which includes a control transistor (ST), a resistor ($R_1$) connected in parallel to the emitter-base junction of the control transistor, and a Zener diode (Z), the Zener diode having its anode connected to the base of the control transistor (ST);

a terminal connection (14) connecting the semiconductor element (11) with the support carrier (15, 15'), said terminal element forming an electrically conductive connection between the semiconductor element (11) which forms the collector terminal of the control transistor (ST);

and terminal connections (20, 21) located at the side of the semiconductor element remote from its connection to the support carrier, said terminal connections forming, respectively, the cathode connection (20) of the Zener diode (Z) and the emitter connection (21) of the control transistor (ST).

7. Structure according to claim 5, wherein the power semiconductor element (10) comprises a Darlington transistor circuit.

8. Structure according to claim 4, wherein the semiconductor elements comprise monolithic integrated circuits ($I_{10}$, $I_{11}$), and the power element (10) comprises a Darlington transistor circuit.

9. structure according to claim 6, wherein the power semiconductor element (10) comprises a Darlington transistor circuit.

10. Structure according to claim 5, wherein the power semiconductor element (10) comprises a Darlington transistor circuit;

said Darlington transistor circuit including a driver transistor (TT) and a power transistor (LT), the collector of the power transistor (LT) being connected to the collector of the driver transistor (TT); the base of the power transistor (LT) being connected to the emitter of the driver transistor (TT);

a resistor ($R_3$) connected in parallel to the emitter-base junction of the driver transistor (TT);

a second resistor ($R_2$) being connected in parallel to the emitter-base junction of the power transistor (LT);

a diode (D) being connected in parallel to the emitter-collector path of the power transistor (LT);

both said driver and power transistors having a common collector terminal (12) formed by an electrically conductive attachment of the power element (10) to the base (13);

and terminal connections (18, 19) on the side of the power element (10) remote from its connection to the base plate (13) and forming the base terminal of the driver transistor (TT) and the emitter connection of the power transistor (LT), respectively.

* * * * *